(12) United States Patent
Imai

(10) Patent No.: US 6,836,067 B1
(45) Date of Patent: Dec. 28, 2004

(54) SWITCHING ELEMENT HAVING INSULATIVE FILM AND ORGANIC FILM AND ELECTROLUMINESCENT ELEMENT DISPLAY DEVICE

(75) Inventor: Kunio Imai, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/517,732

(22) Filed: Mar. 2, 2000

(30) Foreign Application Priority Data

Mar. 3, 1999 (JP) .......................................... 11-056102

(51) Int. Cl.[7] .............................. H01J 1/62; H01J 63/04
(52) U.S. Cl. ...................... 313/504; 313/506; 313/498; 257/20; 257/24; 257/40
(58) Field of Search ................................ 313/504, 506, 313/500, 498; 257/40, 20, 24, 192; 315/169.3; 345/76, 92

(56) References Cited

U.S. PATENT DOCUMENTS

| 4,386,352 | A | * | 5/1983 | Nonomura et al. ............ 345/92 |
| 4,963,503 | A | * | 10/1990 | Aoki et al. ................... 438/27 |
| 5,107,308 | A | * | 4/1992 | Koezuka et al. .............. 257/40 |
| 5,500,537 | A | * | 3/1996 | Tsumura et al. .............. 257/40 |
| 5,621,069 | A | | 4/1997 | Galvin-Donoghue et al. .... 528/379 |
| 5,684,365 | A | * | 11/1997 | Tang et al. ............... 315/169.3 |
| 5,705,826 | A | | 1/1998 | Aratani et al. ................ 257/40 |
| 5,892,244 | A | * | 4/1999 | Tanaka et al. ................ 257/40 |
| 6,008,588 | A | * | 12/1999 | Fujii ....................... 315/169.3 |
| 6,060,333 | A | * | 5/2000 | Tanaka et al. ................ 438/30 |
| 6,060,338 | A | * | 5/2000 | Tanaka et al. ................ 438/99 |
| 6,100,954 | A | * | 8/2000 | Kim et al. ................... 349/138 |
| 6,194,837 | B1 | * | 2/2001 | Ozawa .................... 315/169.1 |
| 6,229,505 | B1 | * | 5/2001 | Fujii ........................... 345/76 |

FOREIGN PATENT DOCUMENTS

| EP | 0 460 242 A1 | 12/1991 |
| JP | 01259564 A | * 10/1989 |

OTHER PUBLICATIONS

Dodabalapur et al., "Organic Smart Pixels", Applied Physics Letters, vol. 73, No. 2, pp. 142–144 (Jul.13, 1998).
Kuo et al., "Field–Effect Transistor with Polyaniline and Poly(2–alkylaniline) Thin Film as Semiconductor", Synthetic Metals, vol. 88, pp. 101–107 (1997).
Sirringhaus et al., "Integrated Optoelectronic Devices Based on Conjugated Polymers", Science, vol. 280, pp. 1741–1744 (Jun. 12, 1998).

* cited by examiner

*Primary Examiner*—Joseph Williams
*Assistant Examiner*—Kevin Quarterman
(74) *Attorney, Agent, or Firm*—Morgan, Lewis & Bockius LLP

(57) ABSTRACT

An organic thin film switching element includes a pair of opposing gate electrodes sandwiching a laminate composed of an insulative film and an organic thin film made of an organic material, laminated one over the other, and an intermediate electrode disposed between the organic thin film and the insulative film. An organic electroluminescence element display device having a display array formed of a plurality of light emitting sections, includes: a substrate having a plurality of first display electrodes formed on a surface in correspondence to the light emitting sections; an organic material layer formed on each of the first display electrodes and including at least one organic electroluminescence material layer capable of emitting light by injecting electrons or holes thereinto; a second display electrode formed in common on the organic material layer; and the organic thin film switching element formed on the substrate and connected to at least one of the first and second display electrodes.

21 Claims, 12 Drawing Sheets

SWITCHING ELEMENT HAVING INSULATIVE FILM AND ORGANIC FILM AND ELECTROLUMINESCENT ELEMENT DISPLAY DEVICE

BACKGROUND OF THE INVENTION

1. Field of the Invention

The present invention relates to a switching element utilizing an organic thin films formed of an organic material, an organic electroluminescence (hereinafter also called "EL") element including a light emitting layer formed of an organic EL material based thin film utilizing the electroluminescence of an organic compound material which emits light by injection of electrons or holes, and an organic EL display device having a plurality of the switching elements arranged in matrix.

2. Description of the Related Art

An electroluminescence element display composed of a plurality of organic electroluminescence elements arranged in a matrix has drawn attention as a display which provides for low power consumption, high display quality, and reduced thickness. As illustrated in FIG. 1, each organic EL element 200 includes a transparent substrate 1 such as a glass substrate or the like having formed thereon a transparent electrode 201 formed, for example, of indium tin oxide (ITO). At least one organic material layer 202 comprising an electron transport layer, a light emitting layer, a hole transport layer and so on, and a metal electrode layer 203 are laminated on the transparent electrode 201. The transparent electrode 201 serving as an anode is applied with a plus voltage, while the metal electrode 203 serving as a cathode is applied with a minus voltage. i.e., a direct current is applied across the transparent electrode and the metal electrode, to cause the light emitting layer within the organic material layer 202 to emit light.

In the organic EL element, excitors are generated by recombination of the electrons injected from the metal cathode and the holes injected into the light emitting layer from the transparent anode, and the excitors emit light in the course of radiation and deactivation. Thus, the organic EL element 200 may be electrically represented as an equivalent circuit as illustrated in FIG. 2. As can be seen from the figure, the element can be replaced with a circuit configuration composed of a capacitive component C and a light emitting diode component E, having a non-symmetric conductivity, coupled in parallel with the capacitive component. Thus, the organic EL element can be regarded as a capacitive light-emitting element. As the organic EL element is applied with a direct current light-emission driving voltage across the electrodes, a charge is accumulated in the capacitive element C. Subsequently, when the applied voltage exceeds a barrier voltage or a light emission threshold voltage inherent to the element, a current begins flowing from one electrode (on the anode side of the diode component E) to the organic functional layer which supports the light emitting layer so that light is emitted therefrom at an intensity proportional to this current. The Voltage V-Current I-Luminance L characteristic of such an element is similar to the characteristic of a diode. Specifically, the current I is extremely small at a light emission threshold Vth or lower, and abruptly increases as the voltage increases to the light emission threshold Vth or higher. The current I is substantially proportional to the luminance L. The organic EL element as mentioned, when applied with a driving voltage exceeding the light emission threshold Vth, exhibits a light emission luminance in proportion to a current corresponding to the applied driving voltage. On the other hand, the light emission luminance remains equal to zero when the driving voltage applied to the element is at the light emission threshold Vth or lower which does not cause the driving current to flow into the light emitting layer.

An organic EL element display device is a light emitting device which has an image display array formed of a plurality of light emitting pixels, i.e., organic EL elements arranged at respective intersections of rows and columns, i.e., arranged in matrix. An exemplary method of driving an organic EL element display device is called a simple matrix driving mode. A display device in accordance with the simple matrix driving mode has a plurality of anode lines and cathode lines arranged in matrix, sand an organic EL element is connected to each of intersections of the anode lines and the cathode lines arranged in matrix. Either of the anode lines or cathode lines are sequentially selected and scanned at regular time intervals, and the other lines are driven by a driving source in synchronism with the scanning, thereby causing organic EL elements at arbitrary intersections to emit light. In this mode, since each organic EL element is lit for an accessed time, a larger current and a higher voltage are required for a larger display screen.

For providing a larger screen size for a display device, organic EL display devices driven in an active matrix driving mode are contemplated in addition to those of the simple matrix driving mode. The display device of this mode is such one that replaces the anode lines and cathode lines with scanning signal lines and data signal lines, respectively, and thin film transistors (TFT) are used for switching elements arranged at respective intersections. Respective pixels are applied with currents by switching associated thin film transistors, causing organic EL elements to emit light. For TFT, an element made of p-Si, a-Si can be employed. Alternatively, MOS-FET (Metal Oxide Semiconductor Field Effect Transistor) may be used to form TFT.

For example, with MOS-FET as a switching element, two reverse conducting regions are formed on a semiconductor substrate, for example, a Si substrate. A silicon oxide ($SiO_2$) thin film and a metal gate electrode are sequentially deposited on the surface of the substrate between the inverse conductive regions. The conductivity on the surface of the substrate is controlled by an electric field applied from the metal gate. Therefore, a Si wafer is required for a display substrate, and a semiconductor substrate is required for a polysilicon substrate and so on. In addition, since an inorganic material must be deposited on such substrates, high temperature processes are typically used for its manufacturing.

Display devices having a larger screen are much in demand. However, if inorganic material switching elements, which require high-temperature processes in the fabrication, are employed for a large organic EL element display device of the active matrix driving mode, the resulting display device will be inevitably expensive.

OBJECT AND SUMMARY OF THE INVENTION

It is therefore an object of the present invention to provide an organic thin film switching element which can be fabricated at relatively low temperatures, and too provide an organic EL element display device which has the organic thin film switching element formed on a common substrate.

An organic thin film switching element according to the present invention comprises:

an insulative film;

an organic thin film made of an organic material, the insulative film and the organic thin film being laminated one over the other;

a pair of opposing gate electrodes sandwiching a laminate composed of the insulative film and the organic thin film; and an intermediate electrode disposed between the organic thin film and the insulative film.

In one aspect of the organic thin film switching element of the present invention, the organic material is an insulating organic compound.

In another aspect of the organic thin film switching element of the present invention, the organic material is a material having an electron transport property. Alternatively, the organic material may be a material having a hole transport property. 5. In addition, the organic material may have a hole and electron transport property.

In still another aspect of the organic thin film switching element of the present invention, the intermediate electrode comprises a pair of opposing electrodes spaced apart from each other, the opposing electrodes being positioned on an interface between the organic thin film and the insulative film between the gate electrodes.

An organic electroluminescence element display device according to the present invention having a display array formed of a plurality of light emitting sections, which comprises:

a substrate having a plurality of first display electrodes formed on a surface in correspondence to the light emitting sections;

an organic material layer formed on each of the first display electrodes and including at least one organic electroluminescence material layer capable of emitting light by injecting electrons or holes thereinto;

a second display electrode formed in common on the organic material layer; and an organic thin film switching element formed on the substrate and connected to at least one of the first and second display electrodes, and including; an insulative film; an organic thin film made of an organic material, the insulative film and the organic thin film being laminated one over the other; a pair of opposing gate electrodes sandwiching a laminate composed of the insulative film and the organic thin film; and an intermediate electrode disposed between the organic thin film and the insulative film.

In one aspect of the organic electroluminescence element display device according to the present invention, the organic thin film made of an organic material of the organic thin film switching element is formed of a portion of the organic material layer.

In another aspect of the organic electroluminescence element display device according to the present invention, the light emitting sections are arranged in matrix.

In another aspect of the organic electroluminescence element display device according to the present invention, the display device further comprises a capacitor formed on the substrate, and connected to at least one of the first and second display electrodes and the organic thin film switching element.

In further another aspect of the organic electroluminescence element display device according to the present invention, the substrate and the first display electrode are transparent.

In still another aspect of the organic electroluminescence element display device according to the present invention, the intermediate electrode of the organic thin film switching element comprises a pair of opposing electrodes spaced apart from each other, the opposing electrodes being positioned on an interface between the organic thin film and the insulative film between the gate electrodes.

In still further another aspect of the present invention, the intermediate electrode and the gate electrode for injecting carriers of the organic thin film switching element are made of a material having a high work function in a case that the carriers are holes. In this aspect of the present invention, the intermediate electrode of the organic thin film switching element comprises a laminate including a first layer made of a material having a work function substantially equal to that of the organic thin film, and a second layer made of a material having a work function lower than that of the first layer.

In still another aspect of the present invention, the intermediate electrode and the gate electrode for injecting carriers of the organic thin film switching element are made of a material having a low work function in a case that the carriers are electrons. In this aspect of the present invention, the intermediate electrode of the organic thin film switching element comprises a laminate including a first layer made of a material having a work function substantially equal to that of the organic thin film, and a second layer made of a material having a work function higher than that of the first layer.

DETAILED DESCRIPTION OF THE PREFERRED EMBODIMENTS

The inventors observed during detailed studies on a conduction mechanism of the organic EL element, that by applying a pulse voltage at 20 KHz from opposite cathode and anode to an organic thin film, i.e., an organic material layer, a charge can be injected to a constant depth into the organic thin film in accordance with the voltage, and reached the present invention. Since a voltage applied in the thickness direction of an organic thin film permits a charge to exist in the organic thin film, other intermediate electrodes such as a source, a drain and so on can be disposed within the organic thin film to direct a current into the electrodes. In other words, a conduction mechanism of a material available for the organic EL element can be utilized to apply a voltage in the thickness direction of the organic thin film to switch a current in the thickness direction or the plane direction of the thin film.

In the following, embodiments according to the present invention will be described with reference to the accompanying drawings.

Figure 1:
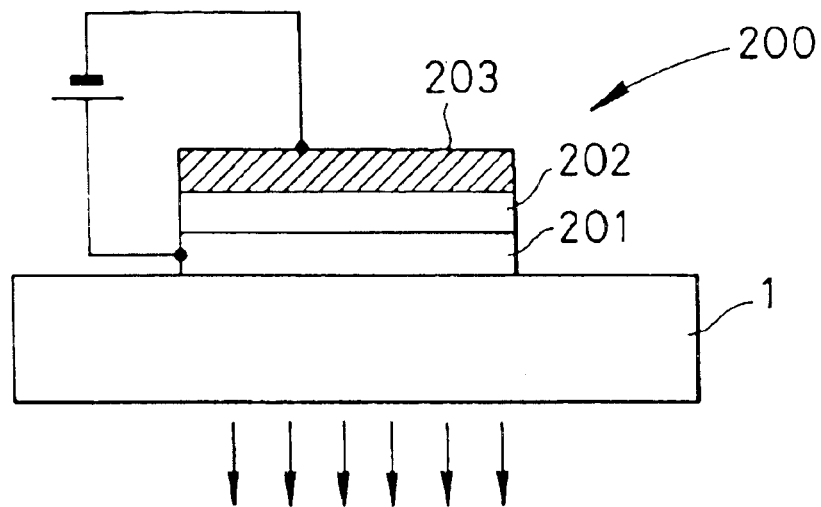
FIG. 1 is an enlarged partial cross-sectional view of an organic EL element display device.
Figure 2:
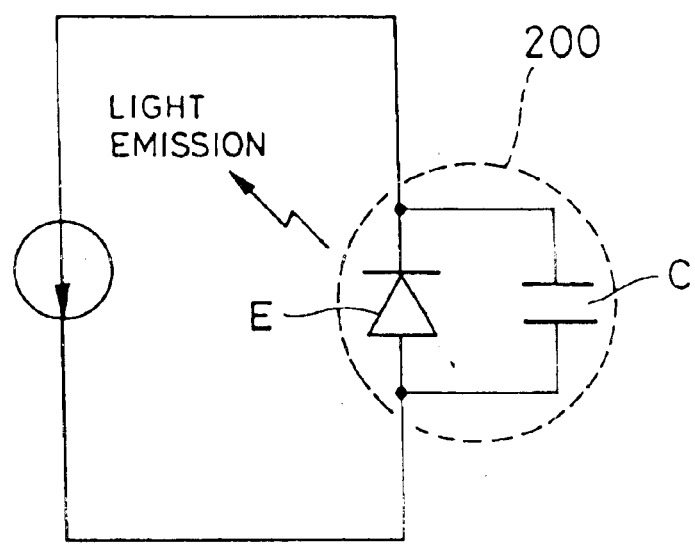
FIG. 2 is a circuit diagram illustrating an equivalent circuit for an organic EL element.
Figure 3:
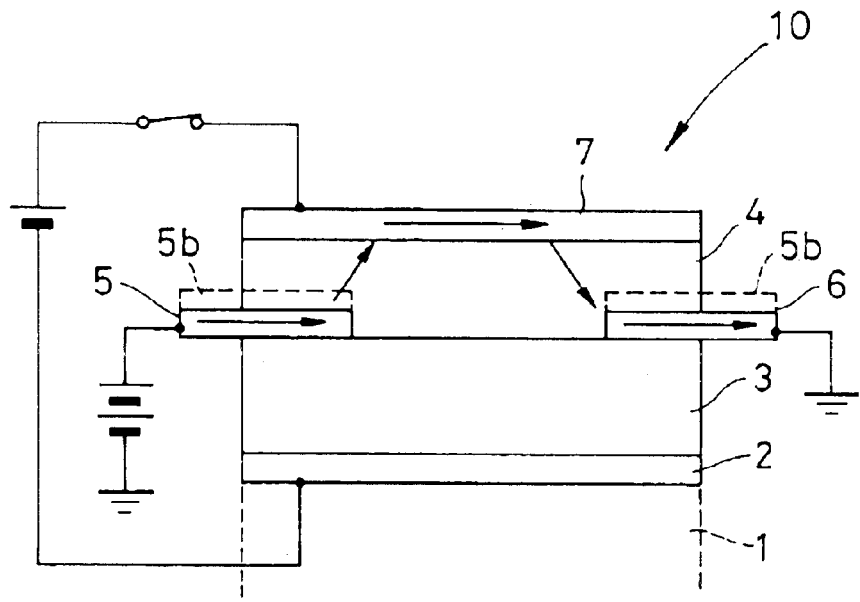
FIG. 3 is a schematic cross-sectional view of an organic thin film switching element according to an embodiment of the present invention.

As illustrated in FIG. 3, a gate electrode 2 is formed on a substrate 1 made of glass or the like for applying an electric field, and an insulative film 3 made of an organic compound such as polyimide is formed on the gate electrode 2. An organic thin film switching element 10 according to a first embodiment is formed on the insulative film 3. The insulative film 3 may be made of polyimide, polyethylene terephthalate or the like. The organic thin film switching element 10 comprises an organic thin film 4 made of an organic compound and formed on the insulative film 3 in which the gate electrode 2 is embedded: intermediate electrodes, i.e., a pair of opposing metal electrodes 5 and 6 formed in the organic thin film 4 with a spacing therebetween; and a gate electrode 7 formed to contact the organic thin film 4 on the metal electrodes 5 and 6 and the spacing therebetween. The gate electrode 7 cooperates with the opposing gate electrode 2 to apply an electric field to the metal electrodes 5 and 6 and the organic thin film 4 interposed therebetween. The gate electrode 7 is positioned to apply an electric field which draws electric flux lines that cross a straight line connecting the metal electrodes 5 and 6. The organic thin film 4 is an insulating organic compound having at least one of properties of an electron transport property and a hole transport property. The organic thin film 4 may be made of polythiophene, copper-phthalocyanine or the like for the hole transport property material, by way of example. Copper-phthalocyanine may be used for a material having a hole and electron transport property for the organic thin film 4. The organic thin film 4 may be made of tris-8-hydroxyquinoline aluminum or the like for the electron transport property material, by way of example.

In the present invention, taking into account the fact that when a positive or negative voltage is applied to the gate electrode 7 placed directly on the organic thin film 4, a charge can be directly injected into the organic thin film 4, the gate electrodes are positioned to sandwich the organic thin film 4 having a hole transport property or an electron transport property, which functions as a channel of the element, to inject holes or electrons into the channel implemented by the organic thin film 4 beneath the gate electrode 7. In the organic thin film switching element 10, when a positive voltage is applied to the organic thin film 4 having the hole transport property to generate an electric field, holes are injected into the organic thin film 4, causing the organic thin film 4 having the hole transport property to function as a channel between the metal electrodes 5 and 6. Conversely, when a negative voltage is applied to the organic thin film 4 having the electron transport property to generate an electric field, electrons are injected into the organic thin film 4, causing the organic thin film 4 having the electron transport property to function as a channel between the metal electrodes 5 and 6. With this state maintained, a potential difference is applied across the metal electrodes 5 and 6, i.e., a source electrode and a drain electrode to permit a current to flow, with the holes or the electrons injected into the organic thin film 4 used as carriers, a current from the source electrode 5 to the drain electrode 6 can be switched by turning the gate voltage on/off.

As illustrated in FIG. 3, in the organic thin film switching element, as an ON voltage is applied to the gate electrode 7 directly bonded on the organic thin film channel to inject a charge into the organic thin film channel, the injected charge causes a current to flow between the opposing metal electrodes 5 and 6. When the voltage to the gate electrode 7 is turned OFF, no charge is injected so that no current flows. Since a fine control for the current by the gate voltage is not required for the organic EL element when driven in the active matrix driving mode, the control for the organic EL element can be implemented only by a pair of organic thin film switches capable of turning a current ON/OFF.

This organic thin film switching element is not provided with an electrically insulating inorganic thin film such as silicon oxide on upper and lower surfaces of the organic thin film 4, but the gate electrode 7 is directly placed on the organic thin film 4. By virtue of the present invention, since a gate voltage can be directly applied to the switching element without any intervening insulating inorganic film, the gate voltage can be significantly reduced. Also, since the element is not capacitive, the switching response is faster. Further, because of the elimination of an insulating inorganic material which generally requires a high temperature process, the switching element of the present invention can be fabricated at relatively low temperatures, and is optimal for use in controlling an organic functional element such as controlling a current in an organic EL element, or the like.

Figure 4:
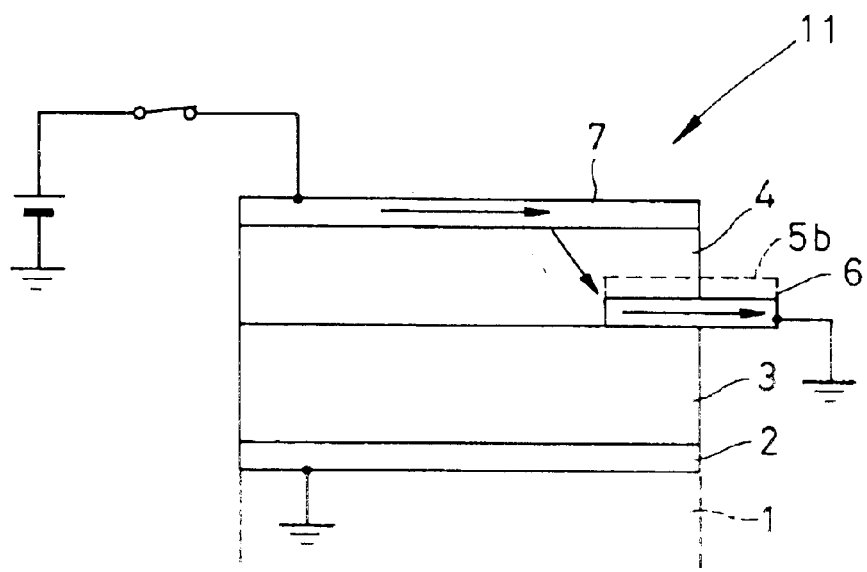
FIG. 4 is a schematic cross-sectional view of an organic thin film switching element according to another embodiment of the present invention.

Further, as illustrated in FIG. 4, one of the opposing metal electrodes 5 appearing in FIG. 3 may be omitted in the organic thin film switching element. In other words, at least one intermediate electrode is only required according to a second embodiment of the present invention. This organic thin film switching element 11 is constructed in such a manner that a charge is injected from one gate electrode 7 for applying an electric field to the organic thin film 4 and further into the drain electrode 6.

Figure 5:
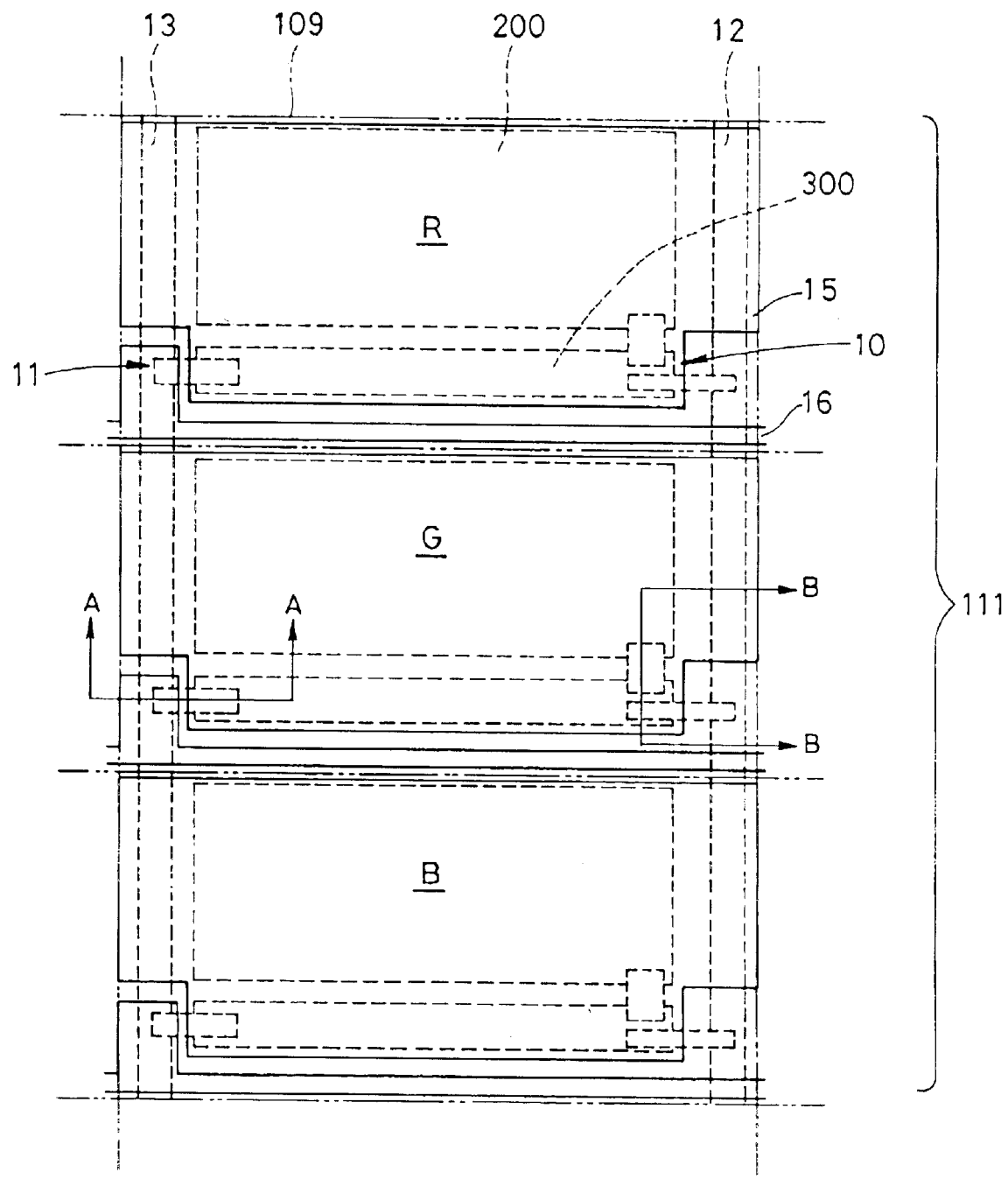
FIG. 5 is a top plan view illustrating a portion of a display panel in an organic EL element display device of active matrix driving mode according to an embodiment of the present invention.

FIG. 5 illustrates a portion of a display panel in an organic EL element display device in accordance with the active matrix driving mode in a third embodiment. This display panel 109 has an image display array composed of a plurality of light emitting pixels 111 arranged in matrix and each consisting of three light emitting sections for red R, green G and blue B (organic EL elements). Each light emitting section in one pixel includes an organic thin film switching circuit formed of two organic thin film switching elements 10 and 11 and a capacitor 300, and an organic EL element 200. Such light emitting sections are combined into a unit for each pixel, and a number of units equal to the total number of pixels are integrated to form a substrate for an organic EL element display device having an image display array composed of a plurality of light emitting pixels arranged in matrix.

On a glass substrate of the organic EL element display device, an anode line 12 and a data signal line 13 are disposed extending in parallel with the organic EL elements 200 and the capacitors 300 sandwiched therebetween. Further, a cathode line 15 and a scanning signal line 16 are arranged at positions electrically spaced from and orthogonal to these lines. The scanning signal lines 16 are sequentially scanned in response to RGB signals to the data signal lines 13 to selectively force organic EL elements 200 in pixels at intersections to emit light.

Figure 6:
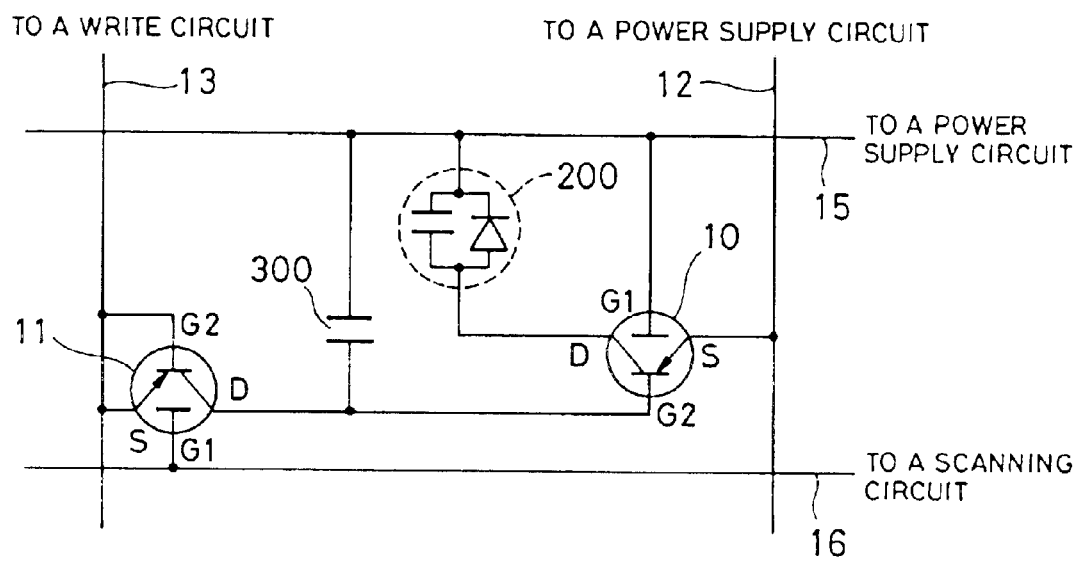
FIG. 6 is a circuit diagram illustrating an organic thin film switching element and an organic EL element formed on a display panel of the organic EL element display device according to the embodiment of the present invention.

FIG. 6 illustrates the circuit configuration of a light emitting section corresponding to a unit pixel of the display panel according to the third embodiment. A gate G1 of the organic thin film switching element 11 is connected to the scanning signal line 16 which is supplied with a scanning signal from a scanning circuit for scanning lines, while a source S of the organic thin film switching element 11 is connected to the data signal line 13, which is supplied with a signal from a write circuit corresponding to data in a frame memory, together with a gate G2.

The organic thin film switching element 11 has a drain D connected to the gate 2 of the organic thin film switching element 10 and the capacitor 300, and also connected to the cathode line 15 through the capacitor 300.

The organic thin film switching element 10 has a source S connected to the anode line 12, while the organic thin film switching element 11 has the drain D connected to an ITO anode, i.e., a first display electrode of the organic EL element 200, and connected to the cathode line 15 through a metal cathode of the organic EL element 200. A gate G1 of the organic thin film switching element 10 is also connected to the cathode line 15. The anode line 12 and the cathode line 15 are connected to a power supply circuit and controlled separately from each other.

For the display panel 109 having a plurality of the foregoing circuits arranged in rows and lines, a light emission control operation for a unit pixel is performed in the following manner. As an ON potential difference is supplied across the gate electrodes of the organic thin film switching element 11, the organic thin film switching element 11 passes a current corresponding to the voltage of data supplied to the source S from the source S to the drain D.

When an OFF potential difference is applied across the gate electrodes of the organic thin film switching element 11, the organic thin film switching element 11 is set in a so-called cut-off state, where the drain D of the organic thin film switching element 11 is opened. Thus, during a period in which an ON potential difference is present across the gate electrodes of the organic thin film switching element 11, the capacitor 300 is charged with a current based on the voltage at the source S, and the voltage is supplied to the gate G2 of the organic thin film switching element 10. The organic thin film switching element 10 is closed based on the gate voltage, so that a current flows through the anode line 12 and pass from the source S to the drain D, and further flows into the ITO anode of the organic EL element 200, causing the organic EL element 200 to emit light.

When an OFF potential difference is present across the gate electrodes of the organic thin film switching element 11, the organic thin film switching element 11 is opened, so that the organic thin film switching element 10 holds the voltage at gate G2 with the charge accumulated on the capacitor 300, sustains a current until the next scanning, and also sustains the light emitted from the organic EL element 200.

Next, a process for manufacturing the display panel 109 for the organic EL element display device will be described with reference to FIGS. 7–12.

Figure 7:
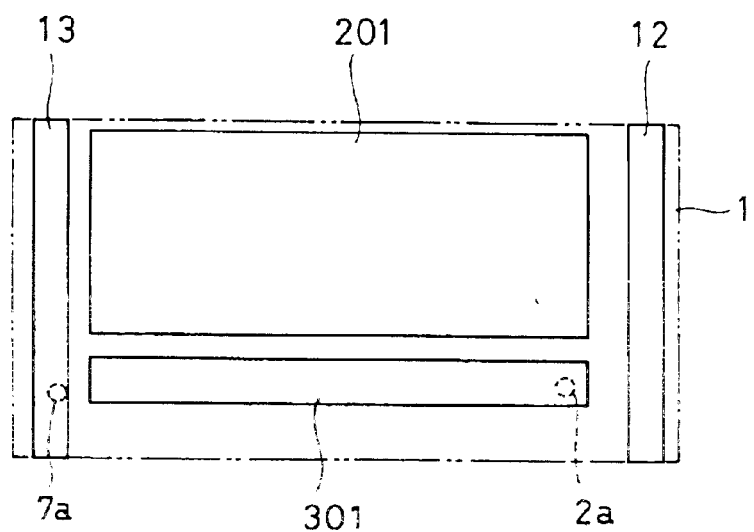
FIGS. 7 through 12 are enlarged partial top plan views schematically illustrating a substrate in several steps of manufacturing the display panel for the organic EL element display device according to the embodiment of the present invention.

First, as illustrated in FIG. 7, an anode line 12, a data signal line 13, one electrode 301 of a capacitor, and a transparent electrode (anode) 210 serving as a first display electrode, all made of ITO, are formed on a glass substrate 1. A region 7a, for subsequently forming the source S and the gate G2 of an organic thin film switching element 11 therein, exists in a portion of the data signal line 13 opposing the electrode 301, and a region 2a, for subsequently forming the gate G2 of an organic thin film switching element 10 therein, exists in a portion of the capacitor electrode 301 opposing the anode line 12. While the shown lines are made of ITO, a metal having a low resistivity such as Al may further be laminated on the lines.

Figure 8:
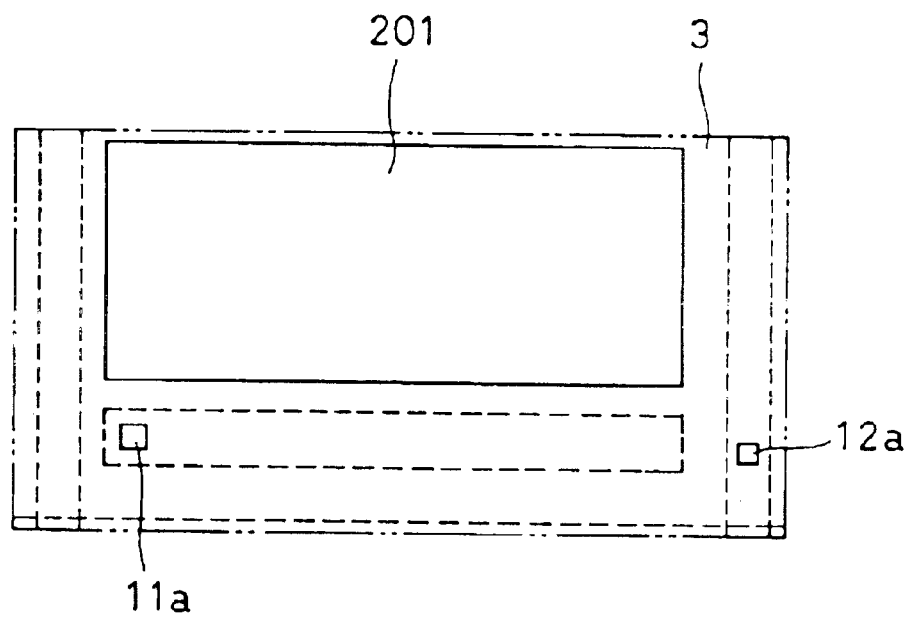

Next, as illustrated in FIG. 8, an insulative film 3 made of photo-sensitive polyimide or the like is deposited over the substrate 1 which has been previously formed with the respective conductors made of ITO. The insulative film 3 has an opening for exposing the transparent electrode 201 or the first display electrode in order to laminate an organic material layer including an organic electroluminescence material layer which is capable of emitting light. Here, the insulative film 3 is formed with a contact hole 11a for the drain of the organic thin film switching element 11 connected to the capacitor, and a contact hole 12a for the source of the organic thin film switching element 10 connected to the anode line 12.

Figure 9:
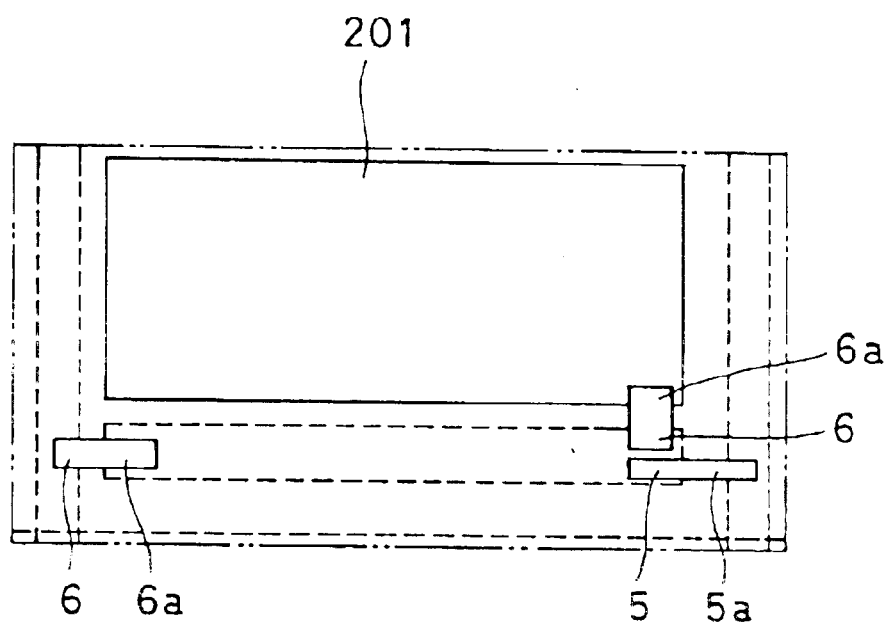

Next, as illustrated in FIG. 9, the drain electrode 6 of the organic thin film switching element 11 and an Al strip of a conductor 6a for connecting this to the capacitor through the contact hole 11a; an Al strip 5a having an end, subsequently formed into the source electrode 5, on the region 2a for subsequently forming the gate G2 of the organic thin film switching element 10 therein; and an Al strip 6a having an end subsequently formed int the source electrode 6 on the same region 2a are deposited on the insulative film 3 by vacuum vapor deposition or the like. The Al strips 5a and 6a are deposited such that their ends opposite to those subsequently formed into the electrodes of the organic thin film switching element 10 are connected to the anode line 12 and the transparent electrode 201 or the first display electrode.

Figure 10:
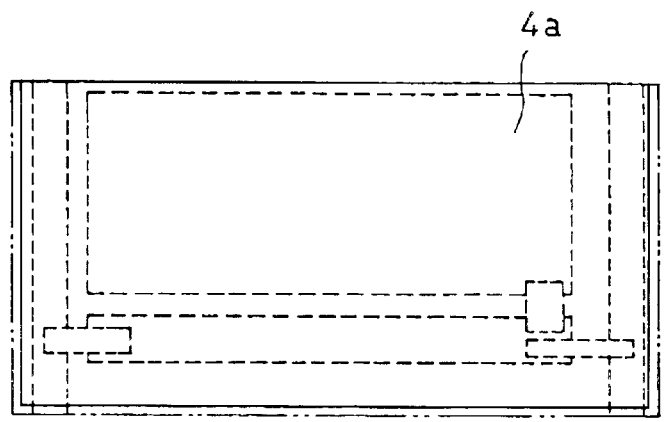

Next, as illustrated in FIG. 10, a hole transport layer 4a is deposited over the entire surface of the substrate.

Figure 11:
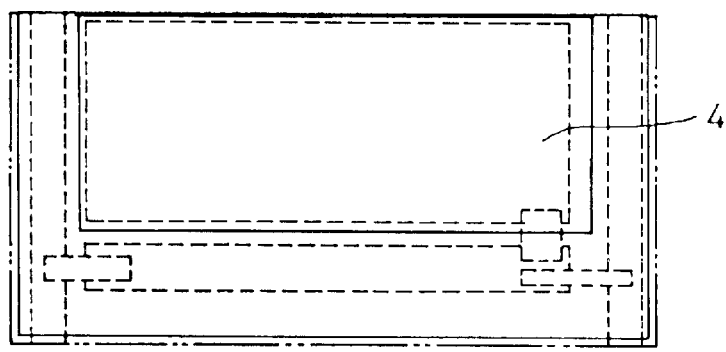

Next, as illustrated in FIG. 11, R, G, B light emitting organic EL media 4 are deposited in a predetermined thickness on the hole transport layer 4a corresponding to the transparent electrode 201 or the first display electrode, using a predetermined EL media deposition mask. The mask is sequentially moved such that a mask opening is positioned from one first display electrode 201 to the neighboring first display electrode to deposit the organic EL media 4. It should be noted that for purposes of planarizing the surface of the substrate and adjusting the capacity of the capacitor, another dielectric material may be deposited in associated portions other than the two organic thin film switching elements and the organic EL media.

Figure 12:
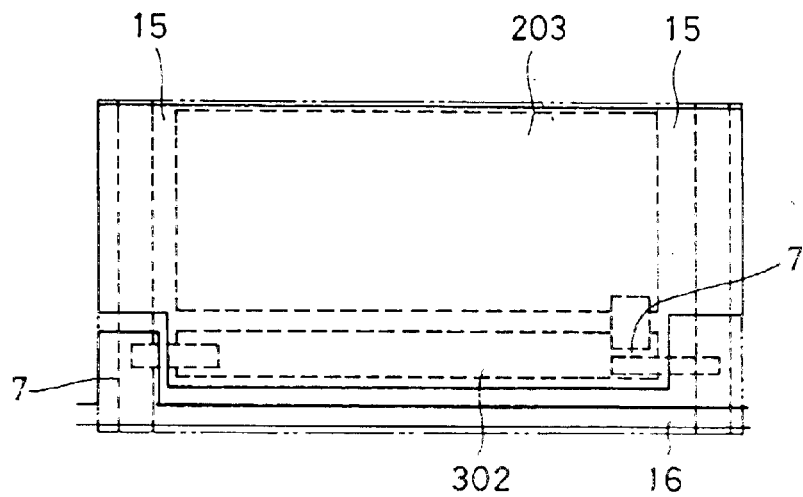

Next, as illustrated in FIG. 12, the deposition mask is removed, and a metal having a low work function such as Al—Li or the like is deposited on the deposited three organic EL media as a second display electrode 203 or the cathode, using means such as vapor deposition, sputtering or the like. This metal film may be grown in a largest possible thickness as long as it does not affect the process. In this step of forming the second display electrode, the cathode line 15 for connecting neighboring second display electrodes 203, and the scanning signal line 16 are simultaneously deposited so as to intersect with the underlying anode line 12 and data signal line 13. Further, an opposing electrode 302 of the capacitor connected to the cathode line 15 and the gate electrode G1 of the organic thin film switching element 11 are also deposited simultaneously.

Figure 13:
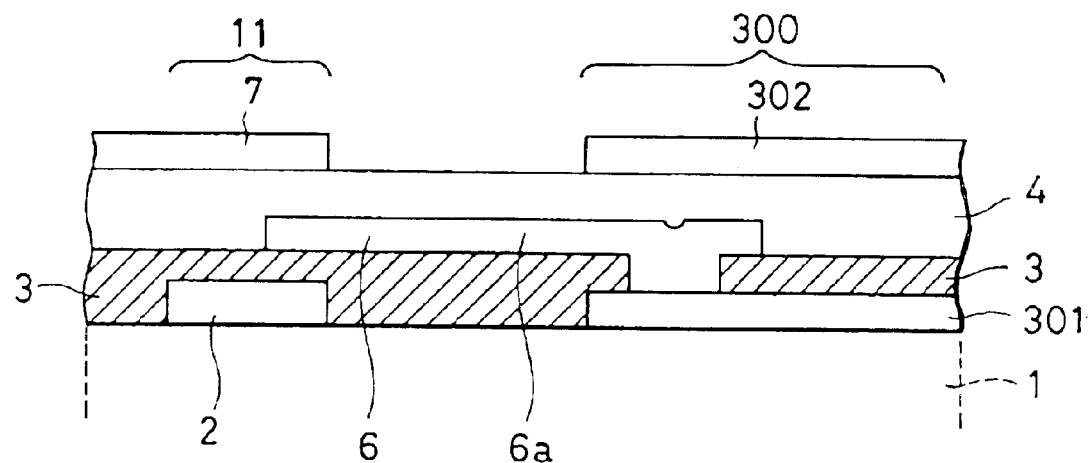
FIG. 13 is a cross-sectional view taken along a line AA in FIG. 5.
Figure 14:
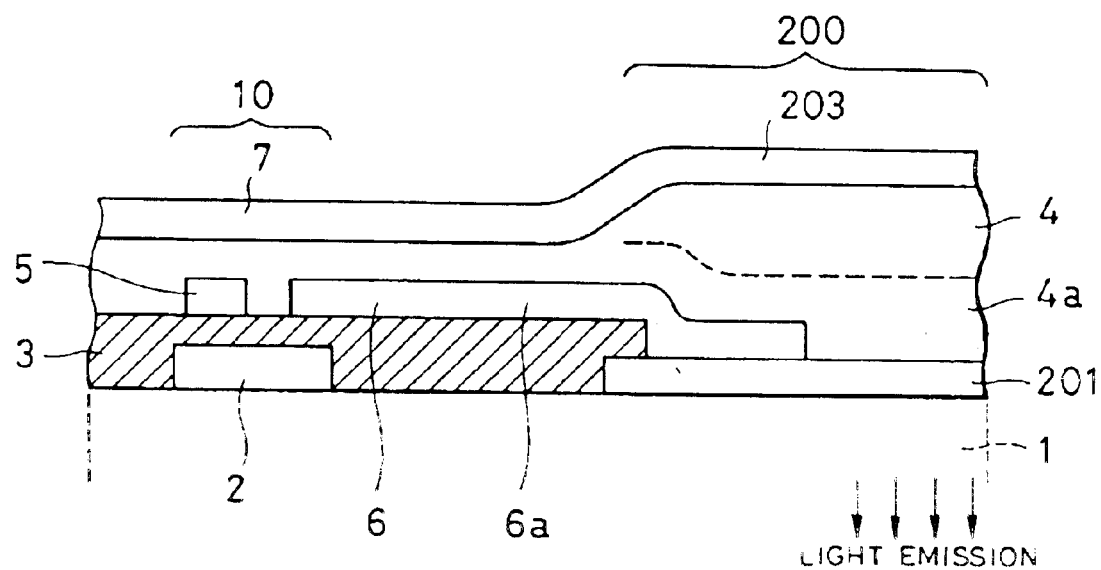
FIG. 14 is a cross-sectional view taken along a line BB in FIG. 5.

The fabricated organic thin film switching elements 11, 10 in the organic EL element display device are illustrated in cross-sectional view in FIGS. 13, 14, respectively. It can be seen that the organic thin film switching elements 11, 10 and the organic EL element 200 are formed on substantially the same plane.

As described above, according to the present invention, the organic thin film switching elements and the organic EL element array can be manufactured simultaneously, thus making it possible to realize a high definition full color display.

Figure 15:
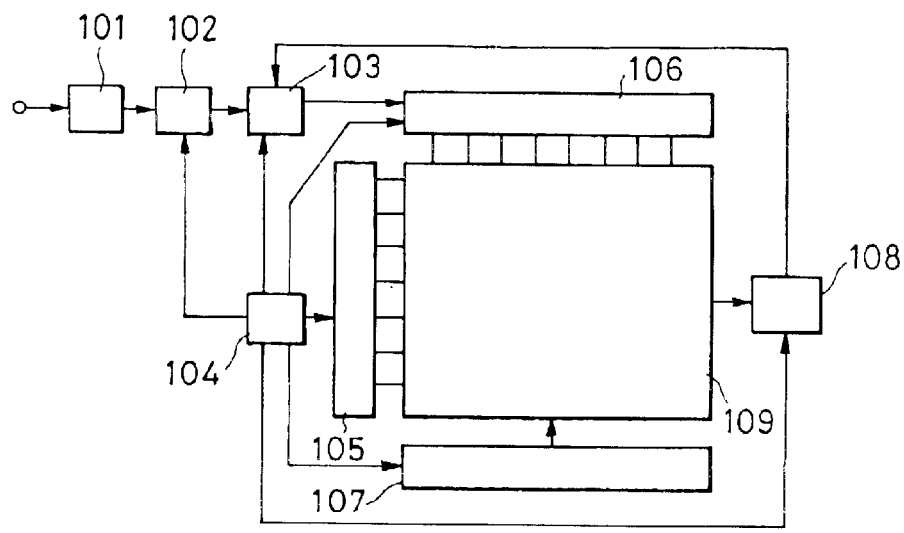
FIG. 15 is a block diagram illustrating an organic EL element display device according to an embodiment of the present invention.

Next, FIG. 15 illustrates in block diagram an organic EL display device according to a fourth embodiment which employs a display panel formed of organic thin film switching elements and an organic EL element array. The illustrated organic EL display device comprises an A/D converter circuit 101, a processing circuit 102, a frame memory 103, a controller 104, a scanning circuit 105, a write circuit 106, a power supply circuit 107, a current value memory 108, and a display panel 109.

The A/D converter circuit 101 receives an analog video signal input, and converts it to digital video signal data. The converted digital video signal is supplied from the A/D converter circuit 101 to the processing circuit 102 which processes the digital video signal based on data from the current value memory 108 under the control of the controller 104. The processed digital video signal is then supplied to the frame memory 103 and written thereinto for accumulation under the control of the controller 104. This processing will be described later. The controller 104 controls the respective circuits up to the power supply circuit 107, other than the frame memory 103, in synchronism with horizontal and vertical synchronization signals of the input video signal.

The digital video signal data accumulated in the frame memory 103 are read by the controller 104 and sent to the write circuit 106. Also, the scanning circuit 105 and the write circuit 106 connected to rows and columns of the display panel, i.e., scanning signal lines 16 and data signal lines 13, are sequentially controlled by the controller 104 to control light emitting durations of electronic EL elements of the display panel 109, corresponding to an image accumulated in the frame memory 103, for example, by a sub-field method or the like, to provide a desired image display. The power supply circuit 107 supplies all organic EL elements of the display panel 109 with power through the anode lines 12 and the cathode lines 15 under the control of the controller 104. The current value memory 108 in turn stores values corresponding to driving currents for organic EL elements, which constitute respective organic EL elements of the display panel 109, under the control of the controller 104.

Now, the aforementioned processing will be described. As mentioned above, a value corresponding to a driving current for each organic EL element is stored in the current value memory 108 when it is so instructed by the controller 104. For example, before powering off the display device, the controller 104 controls all organic EL elements of the display panel 109 to emit light corresponding to the same luminance data.

This means that all the organic EL elements of the display panel 109 are driven at the same constant voltage. The respective organic EL elements indicate different light emission currents, even driven at the same voltage, if they have different light emission characteristics for the driving current. Generally, organic EL elements frequently driven to emit light at a high luminance experience deteriorated light emission luminance characteristics faster than other organic EL elements. In the case of the constant voltage driving, their light emission currents are reduced as compared with other organic EL elements.

Therefore, based on a light emission current of the organic EL element which exhibits the most deteriorated light emission luminance characteristics, driving currents for other organic EL elements are corrected to control light emission durations of the respective organic EL elements based on the corrected light emission gradation data, thus making it possible to provide an image display, where all the organic EL elements of the display panel 109 remain in a light emitting condition exactly proportional to an input video signal.

The current value memory 108 has stored therein current values for correction in accordance with the control of the controller 104 by the method described above. Then, the processing circuit 102 reads a predetermined stored current value in accordance with the control of the controller 104, and finds the ratio of the read current value to the reference value as a correction value for luminance data through a calculation, for example, by dividing the read current value by the reference value for the smallest light emission current value for each of the aforementioned organic EL elements.

The calculated correction values present values of one or more since the minimum value of light emission current is used as a reference value. The digital video signal data input to the processing circuit 102 is divided by the correction value for each pixel thus calculated to derive corrected digital video signal data which is then supplied to the frame memory 103.

A current detector for sending values to the current value memory 108 is connected in series with the organic EL element 200 to detect a current flowing through the organic EL element 200. The value converted to digital data by the A/D converter is stored in the current value memory 108. Alternatively, the current detector may be positioned between the source of the organic thin film switching element 10 and the ground.

Figure 16:
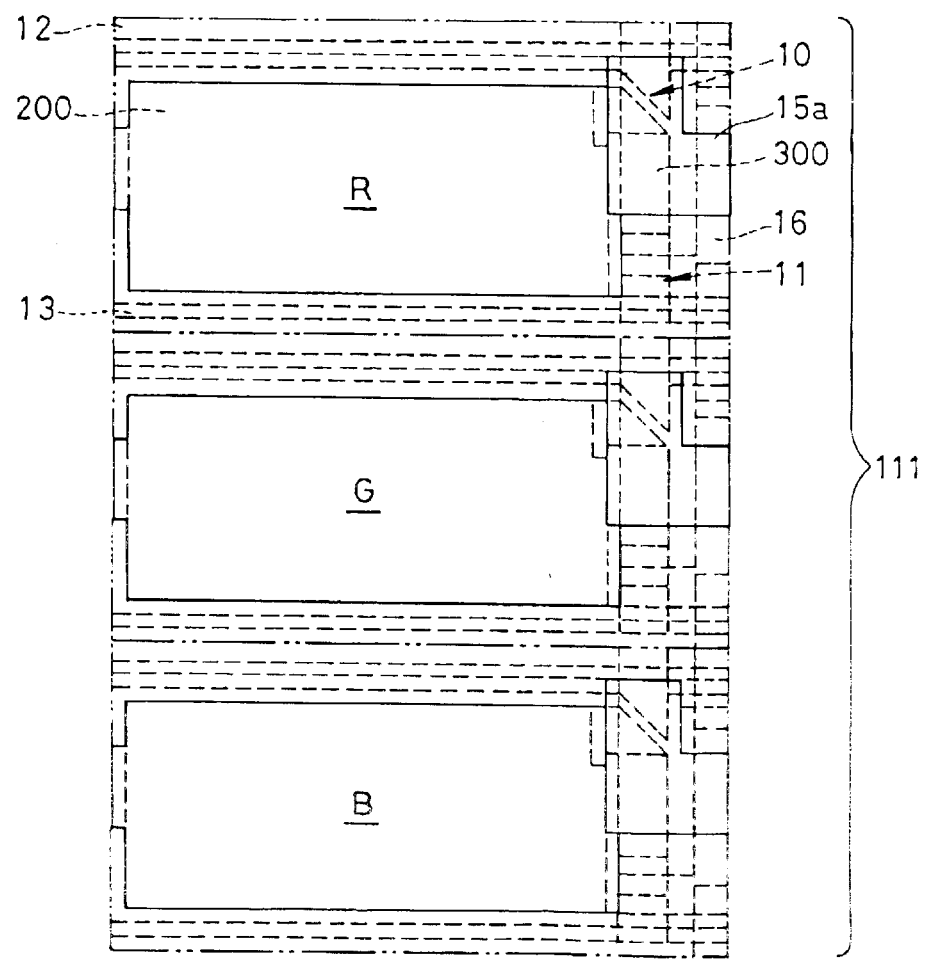
FIG. 16 is a top plan view illustrating a portion of a display panel in an organic EL element display device of active matrix driving mode according to another embodiment of the present invention.
Figure 17:
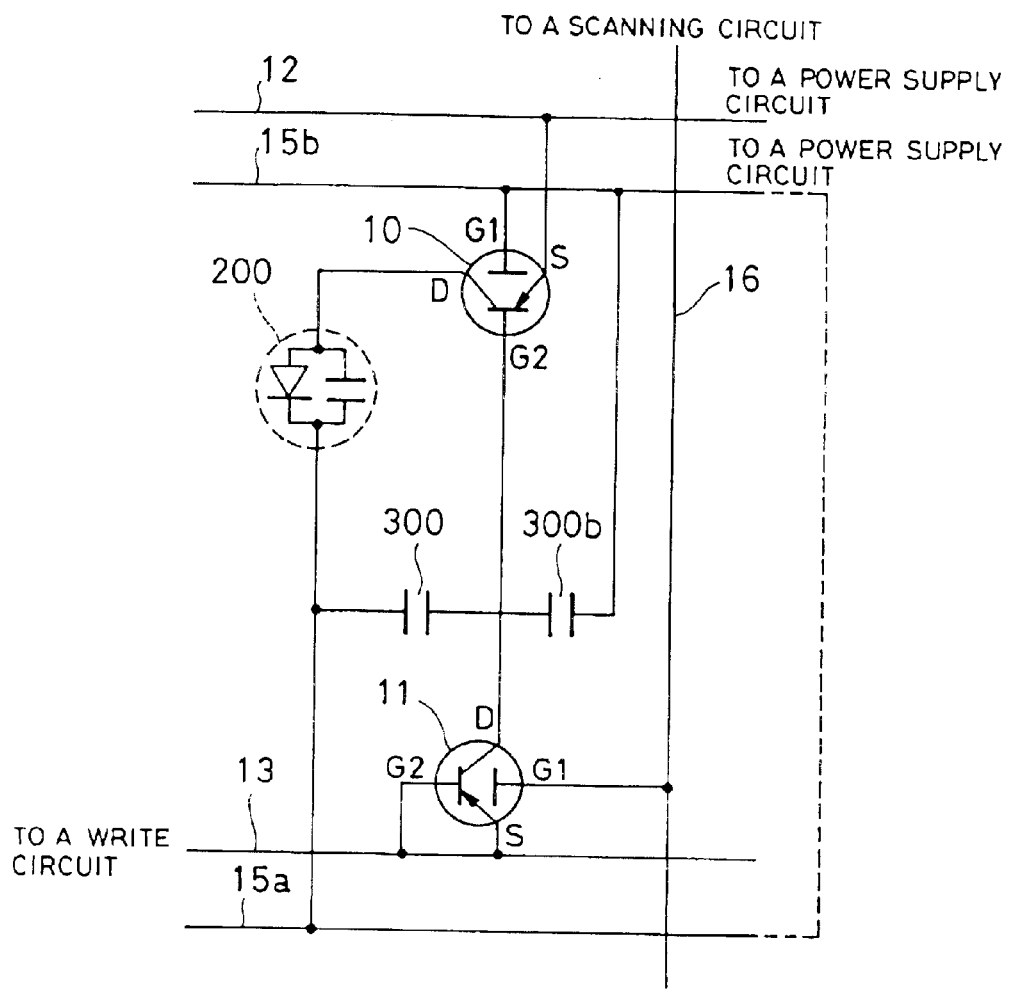
FIG. 17 is a circuit diagram illustrating an organic thin film switching element and an organic EL element formed on a display panel of the organic EL element display device according to the other embodiment of the present invention.

Next, a unit pixel of the display panel 109 for use in the organic EL display device according to the fourth embodiment, and a corresponding circuit configuration for one light emitting section within the unit pixel are illustrated in FIGS. 16, 17, respectively. Since the display panel according to the fourth embodiment is basically similar to the third embodiment, explanation on the members designated by the same reference numerals in the drawings and the light emission control operation therefor, previously described, are omitted. In the display panel according to the fourth embodiment, the cathode lines 15a, 15b are arranged in parallel with the anode line 12 and the data signal line 13. The cathode lines 15a, 15b are connected external to the pixel array. Since the cathode line 15a intersects with the scanning signal line 16, the intersecting portion of the scanning signal line 16 is embedded below the cathode line 15a. The cathode line 15b is disposed between the organic EL element 200 and the anode line 12.

As illustrated in FIG. 17, a capacitor 300b is added, so that the drain D of the organic thin film switching element 11 connected to the gate G2 of the organic thin film switching element 10 is connected to the cathode lines 15a, 15b through the capacitors 300, 300b, respectively. By placing the capacitors 300, 300b one above the other, the capacitive elements can be made compact to increase the area of the display electrode in the organic EL element 200.

With the configuration described above, the organic EL elements 200 in the three light emitting sections for red R, green G and blue B can send signals during separate scanning periods. Further, this facilitate a correction of the difference in characteristics of the three organic EL elements R, G and B. This is because a forward voltage and a bias voltage can be separately supplied through the anode line 12 and the cathode lines 15a, 15b.

Further, in the case that the moving charges are holes, a good conductive material having a high work function is employed for the gate electrodes and the intermediate electrode of the organic thin film switching elements 10 and 11 for injecting carriers in order to facilitate movements of the holes between the electrodes and the organic thin film. On the other hand, in the case that the moving charges are electrons, a good conductive material having a low work function may be employed to facilitate movements of electrons between the electrodes and the organic thin film. In addition, for purposes of blocking the charge from reversely flowing in the direction opposite to the electrode for injecting the carriers, the intermediate electrode may be formed in a two-layered structure composed of a first layer made of a material having a work function substantially equal to that of the organic thin film (5 or 6 in FIGS. 3 and 4), and a second layer formed thereon and made of a material having a work function lower than that of the first layer (5b shown by dotted lines in FIGS. 3 and 4) for the case where the moving charges are holes. On the other hand, for the case where the moving charges are electrons, the intermediate electrode may be formed in a two-layered structure composed of a first layer made of a material having a work function substantially equal to that of the organic thin film, and a second layer formed thereon and made of a material having a work function higher than that of the first layer. The energy gap between the organic thin film and the electrode in this structure prevents a charge from leaking from the capacitor even if a reverse potential occurs between the gate and the drain of the organic thin film switching element.

Next, a process for manufacturing the display panel 109 for the organic EL element display device according to the fourth embodiment will be described with reference to FIGS. 18 through 25

Figure 18:
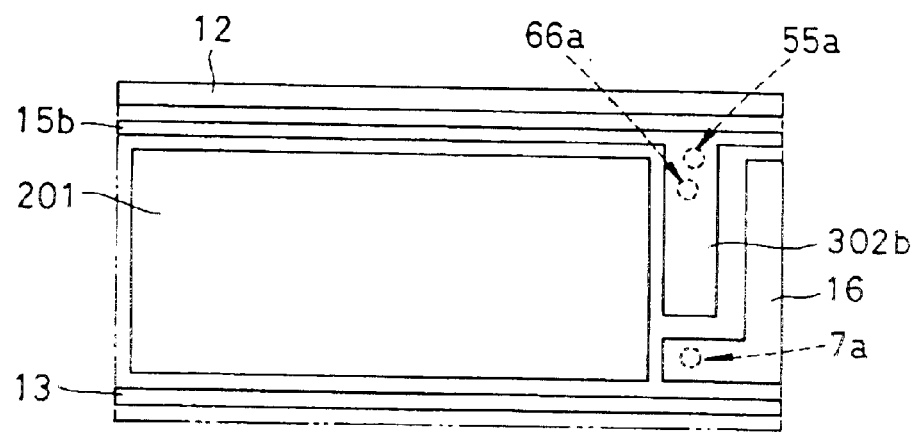
FIGS. 18 through 25 are enlarged partial top plan views schematically illustrating a substrate in several steps of manufacturing the display panel for the organic EL element display device illustrated in FIG. 16.

First, as illustrated in FIG. 18, an anode line 12, a cathode line 15a, one electrode 302b of a capacitor 300b connected to the cathode line 15a, a scanning signal line 16, a gate electrode 7 of an organic thin film switching element 11 connected to the scanning signal line 16, a data signal line 13, and a transparent electrode (anode) 201 or a first electrode, all made of ITO, are formed on a glass substrate 1. Regions 55a, 66a, for subsequently forming therein a source electrode and a gate electrode of an organic thin film switching element 10, exist on the electrode 302b. A metal having a low resistivity such as Al may be further laminated on the respective lines as required.

Figure 19:
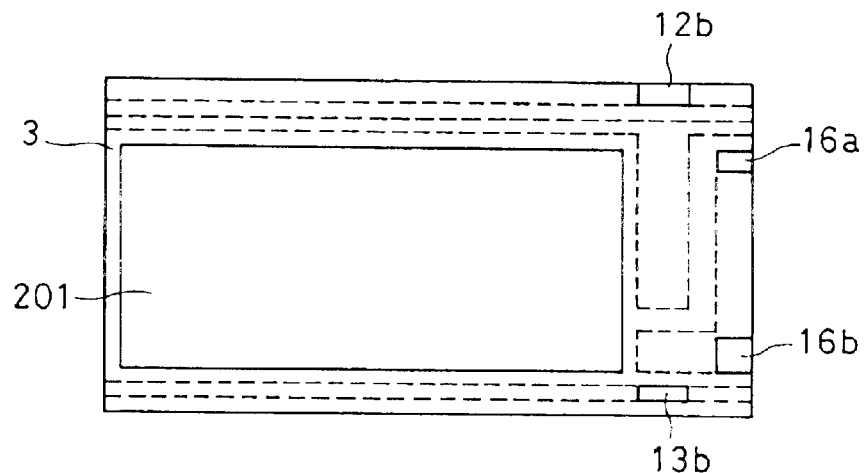

Next, as illustrated in FIG. 19, an insulative film 3 made of photo-sensitive polyimide or the like is deposited on the substrate 1 which has been previously formed with the respective conductors made of ITO. The insulative film 3 has an opening for exposing the transparent electrode 201 or the first display electrode in order to laminate an organic material layer including an organic electroluminescence material layer which is capable of emitting light. Here, the insulative film 3 is formed with a contact hole 13b for the gate and the source of the organic thin film switching element 11 for connecting the same to the data signal line 13, a contact hole 12a for the source of the organic thin film switching element 10 for connecting the same to the anode line 12, and connection contact holes 16a, 16b for crossing the scanning signal line 16 over the anode line 12, the cathode line 15a and the data signal line 13 through the insulative film 3.

Figure 20:
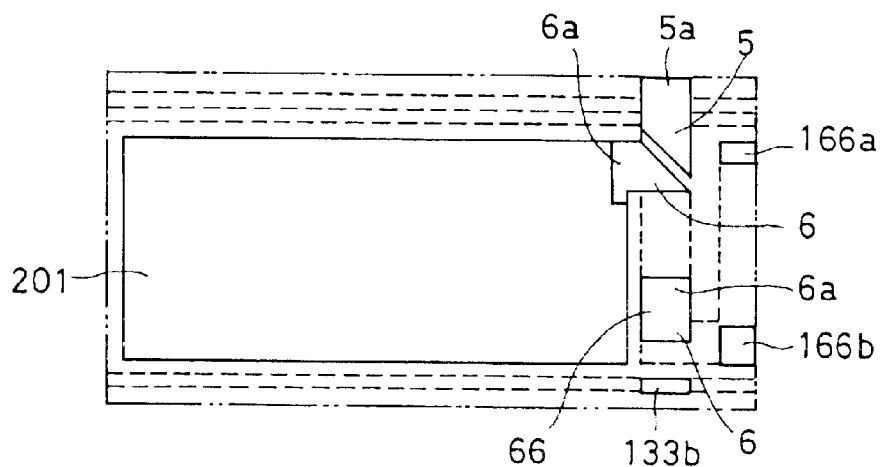

Next, as illustrated in FIG. 20, a laminated strip 66, made of Al or the like, comprising a drain electrode 6 of the organic thin film switching transistor 11 and a conductor 6a for connecting the drain electrode 6 to the capacitor 300b is deposited on the electrode 302b and the gate electrode 7 by photoetching or the like. Simultaneously, a strip 5a made of Al or the like, having an end, subsequently formed into the source electrode 5, and a strip 6a made of Al or the like, similarly having an end subsequently formed into the source electrode 6, are formed on the insulative film 3 in the regions 55a, 66a for the organic thin film switching element 10 by vacuum vapor deposition or the like. The strip 5a made of Al or the like has the other end, opposite to that subsequently formed into the electrode of the organic thin film switching element 10, connected to the anode line 12 through the contact hole 12a, while the strip 6a has the other end, opposite to that subsequently formed into the electrode of the organic thin film switching element 10, connected to the transparent electrode 201 or the first display electrode, respectively. During the step of depositing these electrodes, the connection contact hole 13b, and the contact holes 16a, 16b are filled with Al or the like by vapor deposition to simultaneously form connections 133b, 166a, 166b.

Figure 21:
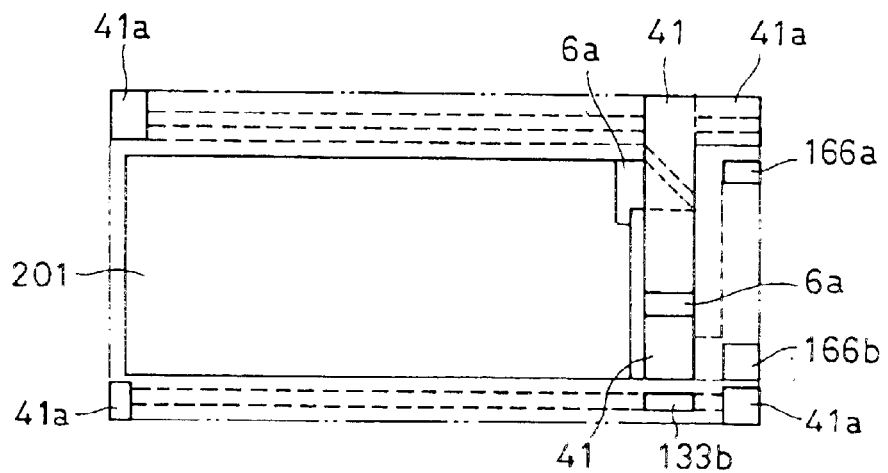

Next, as illustrated in FIG. 21, an organic material having the electron transport property and/or the hole transport property, i.e., a so-called organic semiconductor is deposited on the electrodes 5 and 6 of the organic switching elements 10 and 11 as a thin film. Simultaneously, an organic semiconductor 41a of the same material is deposited at a desired site as a second insulative film. A portion of the organic semiconductor 41 also performs a function of a dielectric layer for the capacitor 300b.

Figure 22:
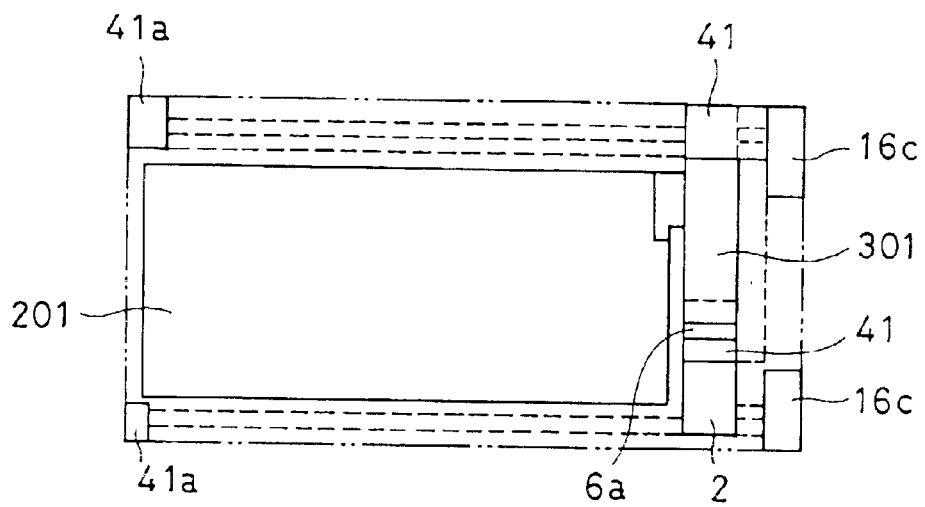

Next, as illustrated in FIG. 22, an electrode 301 made of Al or the like, serving as a common anode for the capacitors 300. 300b, is deposited. A portion of the electrode 301 adjacent to the organic thin film switching element 10 is formed into the electrode 7 for the gate G2 thereof. The opposite end of the electrode 301 is connected to the conductor 6a. Simultaneously, in a portion for forming the organic thin film switching element 11, a source electrode 2 made of Al or the like is deposited on the film of the semiconductor 41 such that it is connected to the connection 133b of the data signal line 13.

Figure 23:
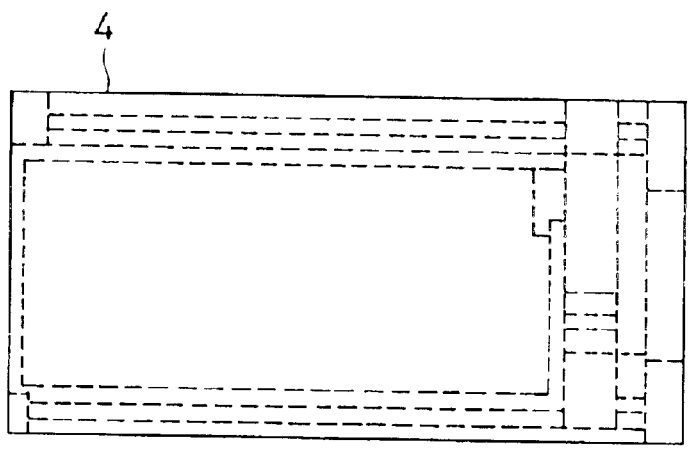

Next, as illustrated in FIG. 23, one or more layers of a thin film 4 made of an organic material, required for the organic EL element such as a hole transport layer, is deposited over the entire surface of the substrate. Here, R, G, B light emitting organic EL media 4 are deposited respectively on the organic material thin film 4 corresponding to the embedded transparent electrode 201 or the first display electrode in a predetermined thickness using a predetermined EL media deposition mask. It should be noted that for purposes of planarizing the surface of the substrate and adjusting the capacity of the capacitor, another dielectric material may be deposited in associated portions other than the two organic thin film switching elements sand the organic EL media.

Figure 24:
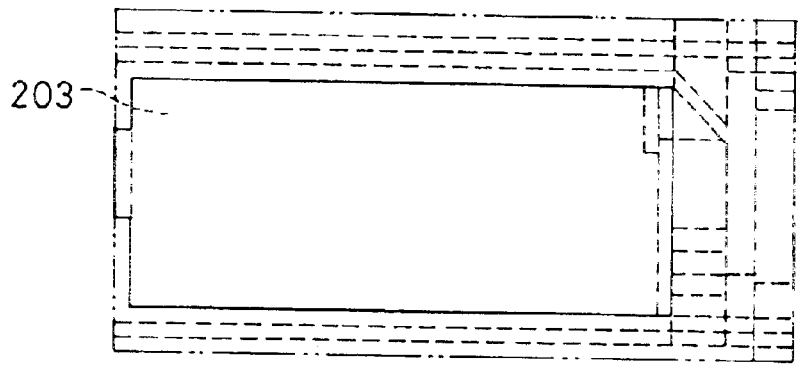
Figure 25:
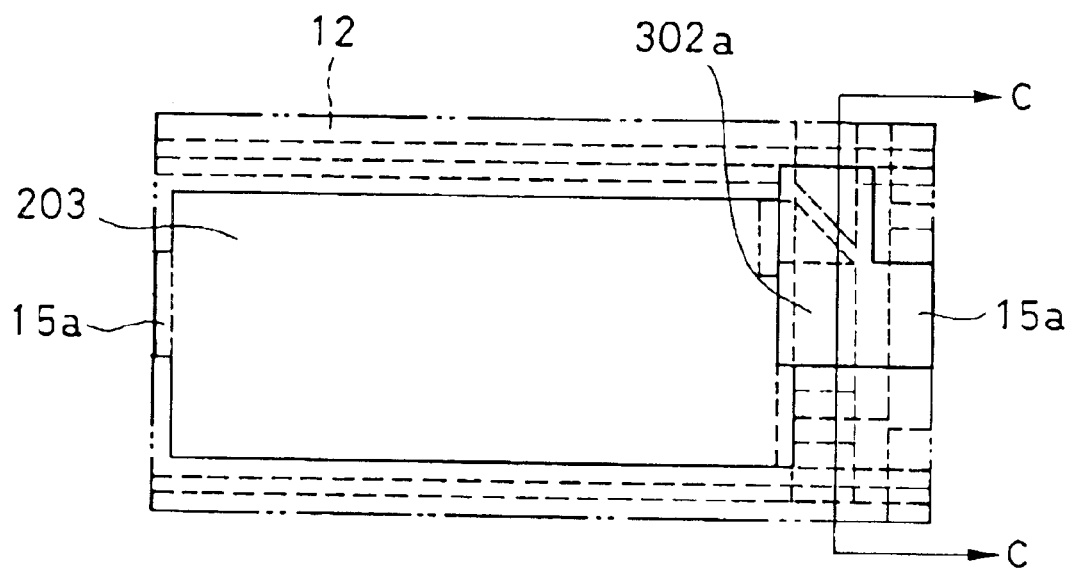

Next, as illustrated in FIG. 24, the deposition mask is removed, and a metal having a low work function such as Al—Li or the like is deposited on the deposited three organic EL media as a second display electrode 203 or the cathode, using means such as vapor deposition, sputtering or the like. This metal film may be grown in a largest possible thickness as long as it does not affect the process. In this step of forming the second display electrode, as illustrated in FIG. 25, the cathode line 15a for connecting neighboring second display electrodes 203 is simultaneously deposited so as to intersect with the underlying anode line 12 and data signal line 13. Further, an opposing electrode 302 of the capacitor connected to the cathode line 15, and the gate electrode G1 of the organic thin film switching element 11 are also deposited simultaneously.

Figure 26:
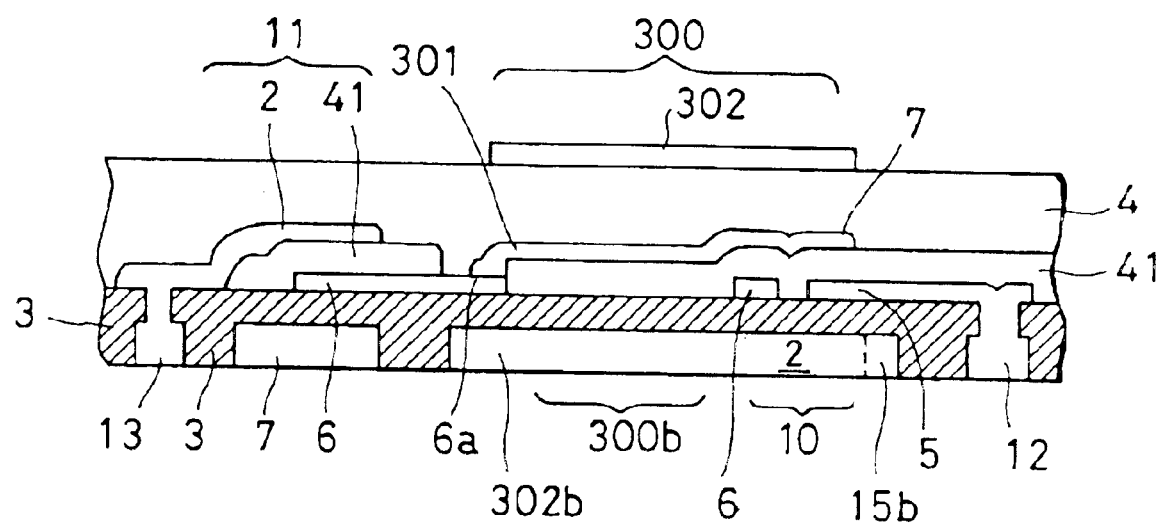
FIG. 26 is a cross-sectional view taken along a line CC in FIG. 25.

The fabricated organic thin film switching elements 11, 10 in the organic EL element display device are illustrated in cross-sectional view in FIG. 26. It can be seen that the organic thin film switching elements 11, 10 and the organic EL element 200 are formed on substantially the same plane.

The organic thin film switching element according to this embodiment and an organic thin film switching element for a comparison example were fabricated specifically. First, an organic thin film FET was fabricated as a comparison example. A gate electrode of Au was formed on a glass substrate and embedded with an insulative film $Si_3N_4$. The insulative film may be inorganic material such as $Al_2O_3$. A source electrode of Au and drain electrode were vapor deposited on the insulative film, and polyhexylthiophene (P3HT) was deposited in a thickness ranging from 100 to 200 angstrom as an organic thin film by spin coating. When a channel length and a channel width were chosen to be 5 $\mu$m and 1000 $\mu$m, respectively, the organic thin film switching element was able to switch a current of 280 $\mu$A with a gate voltage at −50 V and a drain-to-source voltage at 140 V. In this event, the polyhexylthiophene had the conductivity equal to or less than $10^{-8}$ S/cm and the mobility ranging from 0.05 to 0.1 $cm^2$/Vs, and an On/Off ratio of the current equal to or higher than 106.

In the organic EL element full color display with subpixels having the dimension of 0.1 mm×0.3 mm, a necessary luminance can be ensured if a current of 10 $\mu$A or more can flow. It can be said that the organic FET of the comparison example is sufficiently good from a viewpoint of the performance because it has the On/Off ratio exceeding 106, and can control a current of 20 $\mu$A or more when the channel length is 5 $\mu$m and the channel width is 100 $\mu$m. However, its shortcoming is a high driving voltage.

Next, a specific organic thin film switching element according to the present invention is structured such that the carriers are directly injected into the channel without using any insulating inorganic film below the gate electrode, so that the gate voltage was able to be set low. Also, since the channel length extends in the thickness direction of the organic thin film, the channel length is reduced to 0.1 $\mu$m or less. Thus, when the channel width was 28 $\mu$m and the carrier mobility of the organic thin film, injected with the carriers, was 0.1 $cm^2$/Vs, a source-to-drain voltage, required to pass a current of 10 $\mu$A with a gate voltage at 7 V, was an extremely low, namely, 0.36 V. For reference, the aperture ratio of the EL light emitting section was approximately 54%, the capacity of a capacitor for holding a data signal was 0.58 pF, and the line width was able to span over 5/Lm by the photo process, and over 10 $\mu$m by the vapor deposition process.

As described above, the present invention can provide an organic thin film switching element which can be manufactured with a less number of steps than the conventional organic EL element display device manufacturing method, and through a low temperature process. By combining organic EL elements with this organic thin film switching element, and also by forming capacitors for memories of an organic thin film, a display panel can be manufactured only through organic a thin film deposition process. Since the switching element can be manufactured with organic thin films without using a silicon substrate, a large size full color display panel can be manufactured for an organic EL element display device in accordance with the active matrix driving mode through simple manufacturing processes involved in the organic EL panel.

The ability of the switching elements to individually control the organic EL elements enables high speed switching and low voltage driving with several volts of DC voltage, thus providing a highly efficient, high luminance and long life full color display. Since the full color display is digitally driven, it can readily support digital sources which are expected to increasingly spread in future. Since the organic EL element has a photo-electric transducing function, it can be extended to an intelligent full color display in combination with the digital driving mode.

What is claimed is:

1. An organic thin film switching element comprising:
   an insulative film;
   an organic semiconductor layer made of an organic semiconductor and mounded on the insulative film;
   a pair of opposing gate electrodes sandwiching the insulative film and the organic semiconductor layer; and
   an intermediate electrode disposed within the organic semiconductor layer.

2. An organic thin film switching element according to claim 1, wherein the organic semiconductor has a hole transport property.

3. An organic thin film switching element according to claim 1, wherein the organic semiconductor has an electron transport property.

4. An organic thin film switching element according to claim 1, wherein the organic semiconductor has a hole and electron transport property.

5. An organic thin film switching element according to claim 1, wherein the intermediate electrode is made of a material having a work function to facilitate movements of holes between the electrodes and the organic semiconductor layer.

6. An organic thin film switching element according to claim 5, wherein the intermediate electrode comprises a laminate including a first layer made of a material having a work function substantially equal to that of the organic semiconductor layer, and a second layer made of a material having a work function lower than that of the first layer.

7. An organic thin film switching element according to claim 1, wherein the intermediate electrode is made of a material having a work function to facilitate movements of electrons between the electrodes and the organic semiconductor layer.

8. An organic thin film switching element according to claim 7, wherein the intermediate electrode of the organic thin film switching element comprises a laminate including a first layer made of a material having a work function substantially equal to that of the organic semiconductor layer, and a second layer made of a material having a work function higher than that of the first layer.

9. An organic thin film switching element according to claim 1, wherein the pair of opposing gate electrodes include first and second gate electrodes, such that the first gate electrode covers the second gate electrode and the intermediate electrode, and the first and second gate electrodes cooperate with each other to apply an electric field to the intermediate electrode.

10. An organic electroluminescence element display device having a display array formed of a plurality of light emitting sections, comprising:
- a substrate having a plurality of first display electrodes formed on a surface in correspondence to the light emitting sections;
- an organic material layer formed on each of the first display electrodes and including at least one organic electroluminescence material layer capable of emitting light by injecting electrons or holes thereinto;
- a second display electrode formed in common on the organic material layer; and
- an organic thin film switching element formed on the substrate and connected to at least one of the first and second display electrodes, the organic thin film switching element including:
  - an insulative film;
  - an organic semiconductor layer made of an organic semiconductor and mounded on the insulative film;
  - a pair of opposing gate electrodes sandwiching the insulative film and the organic semiconductor layer; and
  - an intermediate electrode disposed within the organic semiconductor layer.

11. An organic electroluminescence element display device according to claim 10, wherein the organic semiconductor layer is formed of a portion of the organic material layer.

12. An organic electroluminescence element display device according to claim 10, wherein the light emitting sections are arranged in matrix.

13. An organic electroluminescence element display device according to claim 10, further comprising a capacitor formed on the substrate, and connected to at least one of the first and second display electrodes and the organic thin film switching element.

14. An organic electroluminescent element display device according to claim 10, wherein the substrate and the first display electrode are transparent.

15. An organic electroluminescence element display device according to claim 10, wherein the intermediate electrode is made of a material having a work function to facilitate movements of holes between the electrodes and the organic semiconductor layer.

16. An organic electroluminescence element display device according to claim 15, wherein the intermediate electrode of the organic thin film switching element comprises a laminate including a first layer made of a material having a work function substantially equal to that of the organic semiconductor layer, and a second layer made of a material having a work function lower than that of the first layer.

17. An organic electroluminescence element display device according to claim 10, wherein the intermediate electrode is made of a material having a work function to facilitate movements of electrons between the electrodes and the organic semiconductor layer.

18. An organic electroluminescence element display device according to claim 17, wherein the intermediate electrode of the organic thin film switching element comprises a laminate including a first layer made of a material having a work function substantially equal to that of the organic semiconductor layer, and a second layer made of a material having a work function higher than that of the first layer.

19. An organic electroluminescence element display device according to claim 10, wherein the pair of opposing gate electrodes include first and second gate electrodes, such that the first gate electrode covers the second gate electrode and the intermediate electrode, and the first and second gate electrodes cooperate with each other to apply an electric field to the intermediate electrode.

20. An organic thin film switching element comprising:
- an insulative film;
- an organic semiconductor layer made of an organic semiconductor and mounded on the insulative film;
- a pair of intermediate electrodes disposed within the organic semiconductor layer so as to confront each other; and
- a gate arrangement for applying an electric field to the organic semiconductor layer between the intermediate electrodes, wherein the gate arrangement includes first and second gate electrodes, such that the first gate electrode covers the second gate electrode and the pair of intermediate electrodes, and the first and second gate electrodes cooperate with each other to apply the electric field.

21. An organic electroluminescence element display device having a display array formed of a plurality of light emitting sections, comprising:
- a substrate having a plurality of first display electrodes formed on a surface in correspondence to the light emitting sections;
- an organic material layer formed on each of the first display electrodes and including at least one organic electroluminescence material layer capable of emitting light by injecting electrons or holes thereinto;
- a second display electrode formed in common on the organic material layer; and
- an organic thin film switching element formed on the substrate and connected to at least one of the first and second display electrodes, the organic thin film switching element including:
  - an insulative film;
  - an organic semiconductor layer made of an organic semiconductor and mounded on the insulative film;
  - a pair of intermediate electrodes disposed within the organic semiconductor layer so as to confront each other; and
  - a gate arrangement for applying an electric field to the organic semiconductor layer between the intermediate electrodes, wherein the gate arrangement includes first and second gate electrodes, such that the first gate electrode covers the second gate electrode and the pair of intermediate electrodes, and the first second gate electrodes cooperate with each other to apply the electric field.

* * * * *